United States Patent [19]

Isono

[11] 3,992,679
[45] Nov. 16, 1976

[54] LOCKED OSCILLATOR HAVING CONTROL SIGNAL DERIVED FROM OUTPUT AND DELAYED OUTPUT SIGNALS

[75] Inventor: Katsuo Isono, Kawagoe, Japan

[73] Assignee: Sony Corporation, Tokyo, Japan

[22] Filed: June 27, 1975

[21] Appl. No.: 590,917

[30] Foreign Application Priority Data

July 5, 1974 Japan............................. 49-76965

[52] U.S. Cl. .................................. 331/1 R; 331/4; 331/17; 331/172; 331/179
[51] Int. Cl.² ........................................... H03B 3/04
[58] Field of Search.................. 331/1 R, 1 A, 4, 9, 331/10, 17, 172, 179

[56] References Cited
UNITED STATES PATENTS

| | | | |
|---|---|---|---|
| 3,083,340 | 3/1963 | Nelson | 331/R X |
| 3,370,254 | 2/1968 | Keller | 331/36 C X |
| 3,614,649 | 10/1971 | Gerig | 331/17 |
| 3,852,681 | 12/1974 | Underhill | 331/1 R |

*Primary Examiner*—Siegfried H. Grimm
*Attorney, Agent, or Firm*—Lewis H. Eslinger; Alvin Sinderbrand

[57] ABSTRACT

A stabilized frequency oscillating circuit comprises a voltage or current controlled variable frequency oscillator, a delay device receiving the output of the oscillator, an adder for adding the output of the oscillator and the delayed output of the delay device, and a detecting circuit which detects the amplitude of the output of the adder to provide a control signal which varies cyclically with changes in the oscillating frequency of the oscillator which is applied to the latter for locking the oscillating frequency of the oscillator to a predetermined or desired frequency. The oscillating circuit may further have a control circuit by which an additional control voltage or current is superimposed on the cyclically varying control signal for selecting the oscillating frequency to which the variable frequency oscillator is to be locked, or by which either the oscillator output or delayed output is phase-shifted before being applied to the adder.

13 Claims, 17 Drawing Figures

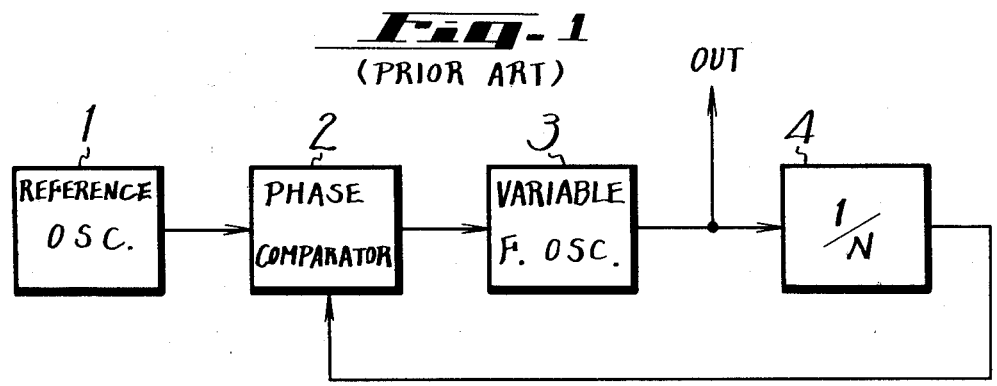
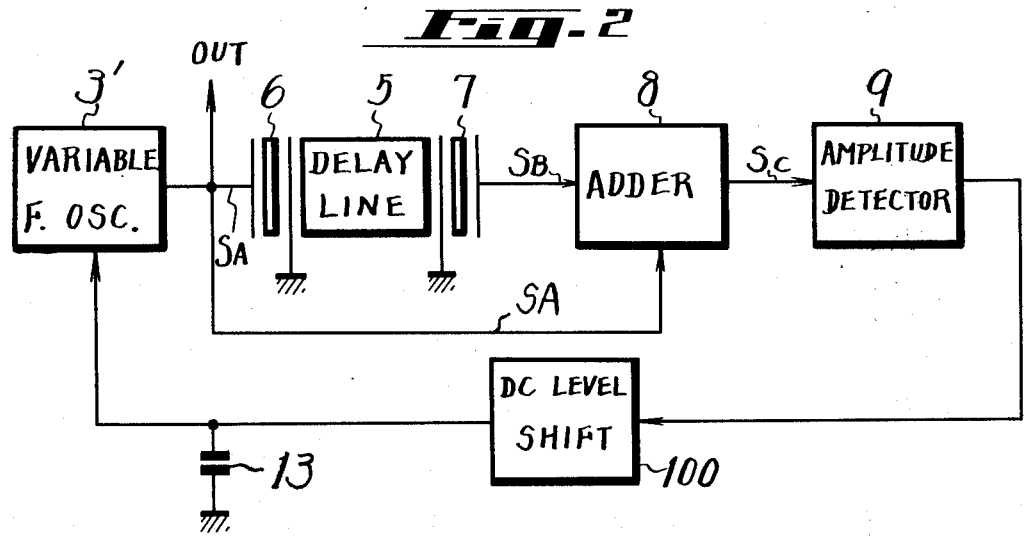
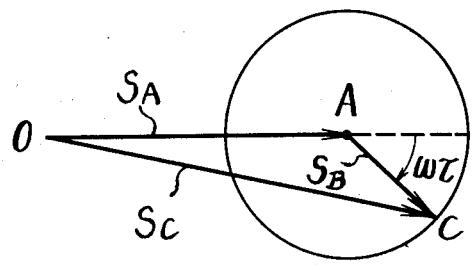

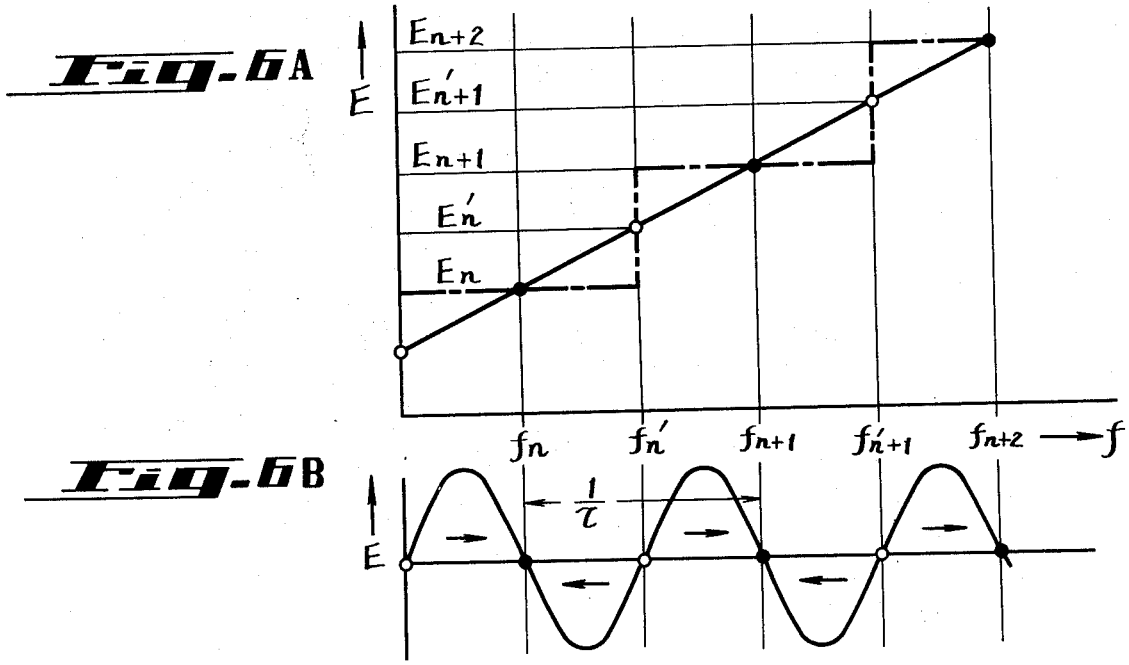
Fig. 6A
Fig. 6B
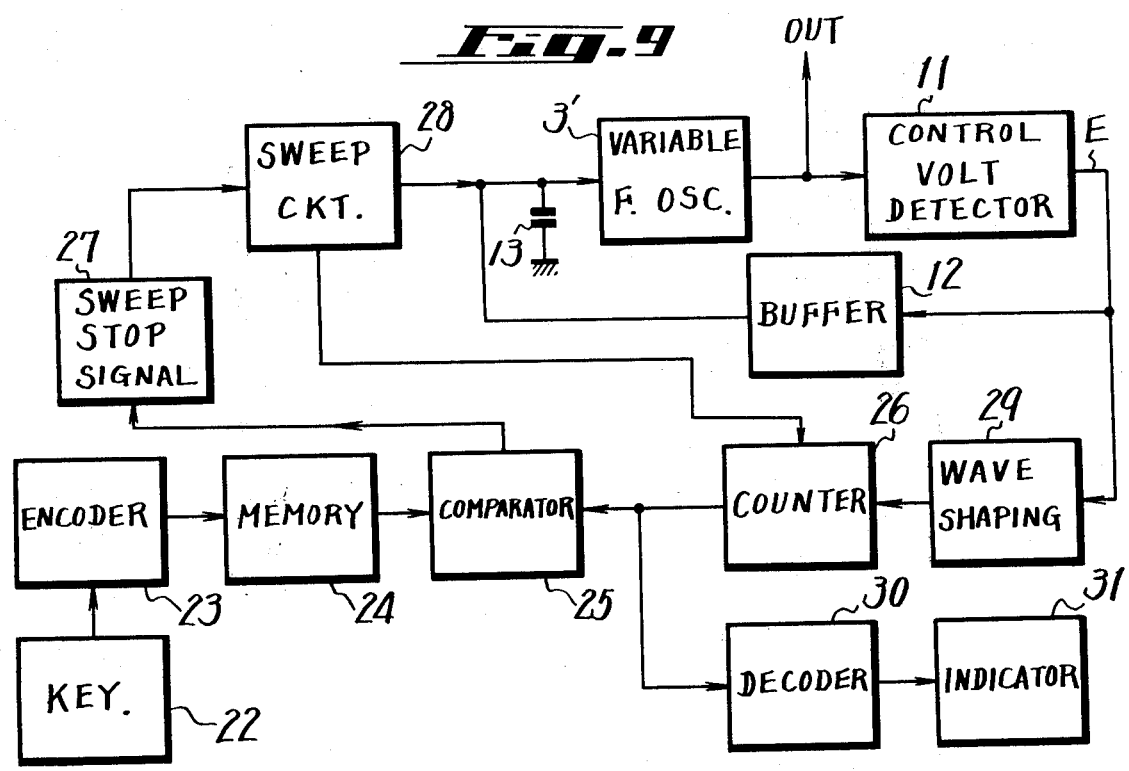
Fig. 9

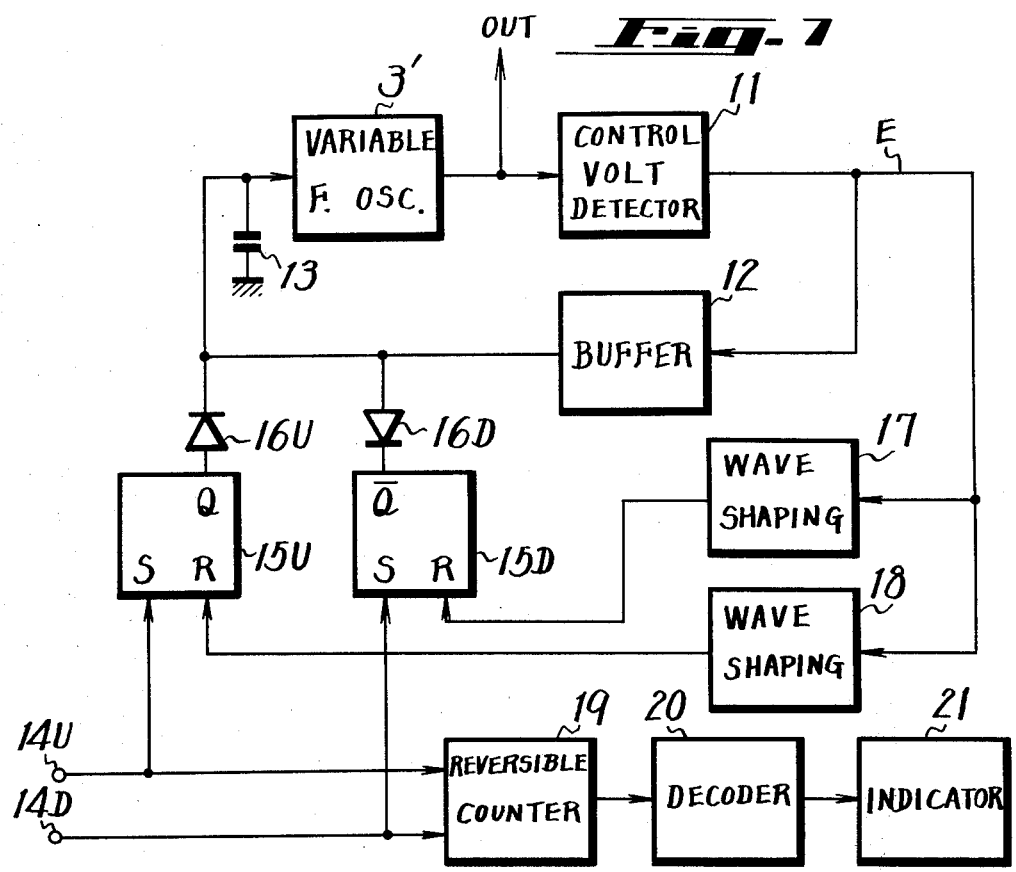

LOCKED OSCILLATOR HAVING CONTROL SIGNAL DERIVED FROM OUTPUT AND DELAYED OUTPUT SIGNALS

BACKGROUND OF THE INVENTION

1. Field of the Invention

This invention relates generally to variable frequency oscillators and more particularly is directed to variable frequency oscillators having a closed control loop by which the oscillator is locked to a predetermined frequency.

2. Description of the Prior Art

As an oscillator having a stabilized frequency, it has been previously proposed to employ a locked oscillator or frequency synthesizer utilizing a phase-lock-loop which comprises a reference oscillator, a variable frequency, usually voltage-controlled oscillator, a frequency divider or multiplier for changing the frequency of the output of the variable frequency oscillator to substantially the same frequency as the output of the reference oscillator, and a phase comparator for comparing the phase of the output of the reference oscillator with the phase of the frequency-change output of the variable frequency oscillator and controlling the variable frequency oscillator in response to the compared output. When the frequency divider or multiplier is fixed, the frequency of the variable frequency oscillator is stably locked to a predetermined frequency, and a signal having that desired frequency can be reliably obtained.

In such prior art locked oscillator or frequency synthesizer, it is possible to change the frequency to which the variable frequency oscillator is to be locked by changing the dividing rate or multiplying rate of the frequency divider or multiplier. However, if the desired frequency to which the variable frequency oscillator is to be locked is relatively high as compared with the output frequency of the reference oscillator, so that the output frequency of the variable frequency oscillator must be divided by a great number so as to substantially correspond to the frequency of the output of the reference oscillator, the response time of the frequency divider becomes undesirably long, and the dividing rate of the frequency divider must be large.

The long response time of the frequency divider causes instability in the frequency locking of the variable frequency oscillator, and the large frequency dividing rate requires a complicated and expensive frequency divider.

OBJECTS AND SUMMARY OF THE INVENTION

An object of this invention is to provide an improved locked oscillator which avoids the above mentioned disadvantages inherent in the locked oscillators of the prior art.

Another object of this invention is to provide an improved locked oscillator which has a novel frequency control closed loop.

A further object of this invention is to provide a simple and inexpensive locked oscillator whose locked oscillating frequency can be varied easily and stably with a simply constructed frequency control closed loop.

In accordance with an aspect of this invention, a stabilized frequency oscillating circuit comprises a variable frequency oscillator for providing an output at a frequency that is determined by a control signal applied to the oscillator, delay means receiving such output from the oscillator for providing a delayed output, and control signal generating means receiving the oscillator output and the delayed output and synthesizing therefrom a control signal which varies, preferably cyclically, in response to changes in the frequency of the oscillator output, and which is applied to the oscillator for locking the output of the latter to a desired frequency.

In preferred embodiments of the invention, the control signal generating means may include an adder which adds the oscillator output and the delayed output to provide an added output, and a detecting circuit which detects the amplitude of the added output to provide the cyclically varying control signal. Further, the frequency to which the oscillator output is locked may be simply determined or selected by superimposing a control signal of selected amplitude on the cyclically varying control signal which is applied to the oscillator, or by phase-shifting either the oscillator output or the delayed output before applying the same to the adder.

The above and other objects, features and advantages of the present invention, will be apparent from the following description which is to be read in conjunction with the accompanying drawings.

BRIEF DESCRIPTION OF THE DRAWINGS

FIG. 1 is a schematic block diagram showing a frequency synthesizer with a phase-lock-loop according to the prior art;

FIG. 2 is a schematic block diagram showing a basic unit of a locked oscillator in accordance with an embodiment of the present invention;

FIG. 3 is a vector diagram to which reference will be made in explaining the present invention;

FIGS. 6A and 6B are waveform diagrams to which reference will be made in explaining the operation of the embodiments shown in FIGS. 2 and 4;

FIG. 7 is a schematic block diagram showing another embodiment of a locked oscillator in accordance with the present invention;

FIGS. 8A, 8B, 8C, 8D and 8E are waveform diagrams to which reference will be made in explaining the operation of the embodiment shown in FIG. 7;

FIGS. 9 and 10 are schematic block diagrams showing additional embodiments of a locked oscillator in accordance with the present invention.

DESCRIPTION OF THE PREFERRED EMBODIMENTS

Figure 4:
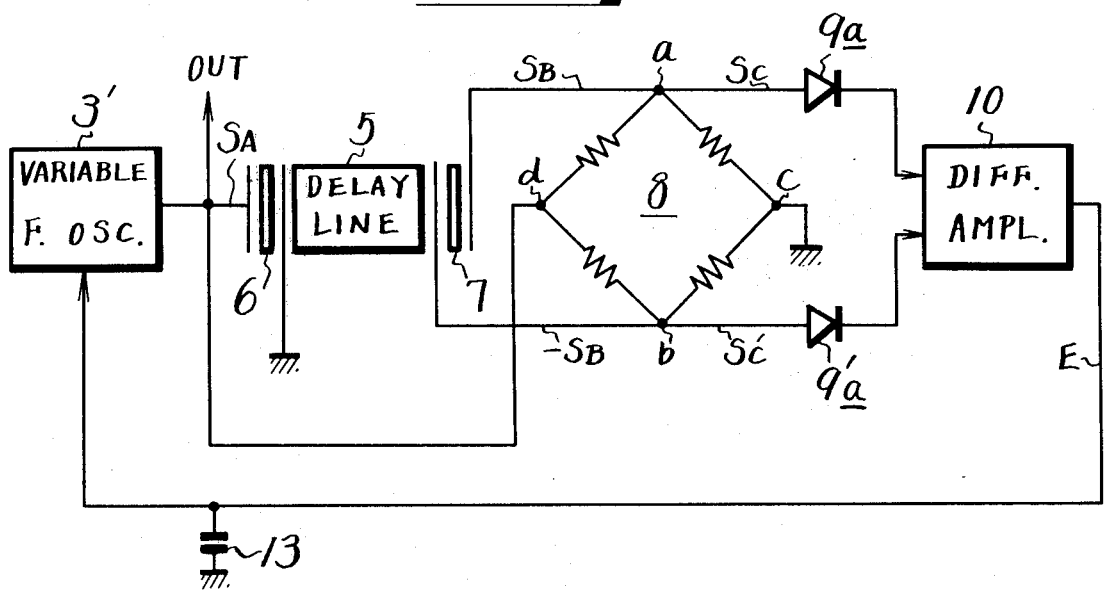
FIG. 4 is a schematic block diagram showing another embodiment of a locked oscillator in accordance with the present invention.

In order to facilitate understanding of the present invention and the advantages thereof, a prior art frequency synthesizer utilizing a phase-lock-loop will be first described with reference to FIG. 1.

As shown on FIG. 1, the frequency synthesizer is composed of a reference oscillator 1 which oscillates precisely at a reference frequency $f_o$, variable frequency oscillator 3 of the voltage-controlled type in which a varactor diode is normally used, a 1/N frequency divider 4 by which an oscillating output of frequency $f$ from the variable frequency oscillator 3 is frequency-divided with a dividing ratio N programmed as selected by an externally applied input signal, and a phase comparator 2 by which a signal of frequency $f/N$ derived from 1/N frequency divider 4 is compared in phase with the output of reference oscillator 1 to provide a corresponding control voltage. Such control voltage from the phase comparator 2 is applied to the variable frequency oscillator 3 for maintaining the oscillating output from the latter at the frequency $f=Nf_o$. Accordingly, a signal of desired frequency can be obtained from oscillator 3 by suitably programming or selecting the frequency dividing ratio N. However, as previously mentioned, if the frequency $f$ of the oscillating output of oscillator 3 is to be many times greater than the frequency $f_o$ of reference oscillator 1, that is, if the dividing ratio N is to be large, the 1/N frequency divider 4 becomes undesirably complicated and expensive. Further, in the above case, the response time of the frequency divider 4 becomes undesirably long and may cause instability in the locking of the output of oscillator 3 to the desired frequency.

Referring now to FIG. 2, it will be seen that an embodiment of a locked oscillator according to this invention comprises a voltage-controlled variable frequency oscillator 3' which is similar to that used in the frequency synthesizer with a phase-lock-loop shown on FIG. 1. An output signal $S_A$ obtained at an output terminal of variable frequency oscillator 3' has the frequency $f$ which is adapted to be increased in response to increases in a control voltage E applied to a control terminal of oscillator 3'. The locked oscillator according to this invention is further shown to comprise signal delay means, for example, an ultrasonic delay line which is provided with an input transducer 6 (electric to ultrasonic wave) and an output transducer 7 (ultrasonic wave to electric signal). The delay time $\tau$ of delay line 5 is determined by the sonic speed $v$ in the ultrasonic wave medium and the length $l$ of such medium as being $\tau=l/v$, and the delay time is almost not at all influenced by frequency characteristics.

The oscillating output signal $S_A$ of variable frequency oscillator 3' is fed to the input transducer 6 of delay line 5 and an output signal $S_B$ having the delay time $\tau$ is derived from the output transducer 7 of delay line 5. This output signal $S_B$, which is attenuated in level due to the loss of delay line 5, is applied to an adder circuit 8 where it is added to the oscillating output signal $S_A$ which is directly fed thereto from variable frequency oscillator 3'.

If the oscillating output signal $S_A$ of variable frequency oscillator 3' is expressed as $a \sin \omega t$, and the signal $S_B$ derived from the delay line 5 is expressed as $a' \sin \omega(t - \tau)$, an output or composite signal $S_C$ from adder circuit 8 is expressed as follows:

$$S_C = a \sin \omega t + a' \sin \omega(t - \tau) \quad (1)$$

Referring now to FIG. 3, it will be seen that the line OA is a vector indicating the signal $S_A$ and a line AC is a vector indicating the signal $S_B$. Assuming that the vector OA is stationary with respect to the vector AC and the vector AC rotates about the point A with the phase difference between vectors OA and AC being $\omega\tau$, then, the above mentioned composite signal $S_C$ is represented by the vector OC, and the amplitude characteristic B of this composite signal $S_C$ is expressed as follows:

$$B = a \sqrt{1 + m^2 + 2m \cos \omega} \quad (2)$$

where $m = a'/a$.

If the condition of $m<1$ is assumed due to the loss of the delay line 5, equation (2) may be approximately rewritten as follows:

$$B = a + a' \cos \omega\tau \quad (3)$$

Continuing with the circuit shown on FIG. 2, it will be seen that the amplitude of the composite signal $S_C$ is detected by an amplitude detecting circuit 9 to derive therefrom a detected output voltage E which is proportional to the amplitude characteristic expressed by equation (3). That is, the output voltage E of detecting circuit 9 is expressed as follows:

$$E = \{a + a'(\cos\omega\tau)\}K \quad (4)$$

where $K$ is the detecting efficiency. This output voltage E is applied to a DC level shift circuit 100 by which the output voltage E has its DC level shifted to obtain a voltage E' as follows:

$$E' = (a' \cos \omega\tau)K \quad (5)$$

Next, consideration will be given to the case where the output voltage E' of the DC level shift circuit 100 expressed by equation (5) becomes zero, that is, where the following condition occurs:

$$(a' \cos \omega\tau)K = 0 \quad (6)$$

In order to satisfy equation (6), it is necessary to obtain the following relation:

$$\cos 2\pi f \tau = 0 \quad (7)$$

A condition which satisfies equation (7) is as follows:

$$2\pi f\tau = n\pi + \pi/2 \quad (n = 0, 1, 2, \ldots) \quad (8)$$

From equation (8), the following equation is obtained:

$$f = (n/2 + 1/4)1/\tau \quad (n = 0, 1, 2, \ldots) \quad (9)$$

Accordingly, in the circuit arrangement shown in FIG. 2, if the feedback loop from the output terminal of the DC level shift circuit 100 to the control terminal of the variable frequency oscillator 3' is removed to form an open loop, and a control voltage is applied from the outside to the control terminal of variable frequency oscillator 3' and is increased as represented by the solid line on FIG. 6A for increasing the output oscillating frequency $f$, the output voltage E' of the DC level shift circuit 100 will be varied in a cyclical manner as shown on FIG. 6B, and as is apparent from equations (5) and (9). In the foregoing case, the variable frequency oscillator 3' has its oscillating frequency $f$ increased in proportion to the externally applied control voltage. When each point where the output voltage E' becomes zero in the waveform of FIG. 6B is taken into account, each frequency $f_n, f_{n+1}, \ldots$ indicated by a solid black dot and at which the voltage E' changes from a positive half cycle to a negative half cycle becomes a stable point to which the oscillating frequency is locked as shown by arrows, and each frequency $f_n', f_{n+1}', \ldots$ indicated by a circle and at which the voltage E' changes from a negative half cycle to a positive half cycle becomes an unstable point. Accordingly, the frequency $f_n$ at a stable point and the frequency $f_n'$ at an unstable point are obtained from equation (9) as follows:

$$f_n = (n + 1/4)1/\tau \quad (n = 0, 1, 2, \ldots) \quad (10)$$

$$f_n' = (n + 3/4)1/\tau \quad (n = 0, 1, 2, \ldots) \quad (11)$$

As will be obvious from equations (10) and (11), the frequency difference between one stable point or unstable point and next stable point or unstable point, respectively, is $1/\tau$, and hence such frequency difference depends only upon the delay time $\tau$ of delay line 5. As previously described, the delay time $\tau$ of delay line 5 is determined by the length or size of the ultrasonic wave medium and the speed of sound transmission therethrough, so that the delay time is little affected by frequency. As a result, in the locked oscillator according to this invention, the frequency difference between one stable point and next stable point can be determined quite reliably.

If a feedback loop is provided to apply a control voltage from the DC level shift circuit 100 to the variable frequency oscillator 3', as on FIG. 2, the oscillating frequency is adapted to be locked to the frequencies $f_n \cdot f_{n+1}, \ldots$ at the stable points, so that the relation between oscillating frequency and control voltage is expressed as a voltage waveform increasing step by step (graded voltage waveform) as shown by broken lines on FIG. 6A. If the reference oscillating frequency of the variable frequency oscillator 3', that is, the frequency at which the variable frequency oscillator 3' oscillates in the initial condition is $f_n$, the output voltage E' of the DC level shift circuit 100 for achieving that reference oscillating frequency is $E_n$. If the voltage E' is varied in a range between $E_n'$ and $E'_{n+1}$ by an external control voltage source or by frequency triggering, the oscillating frequency $f$ is locked to the frequency $f_{n+1}$ which is higher than $f_n$ by $1/\tau$. Therefore, if the frequency triggering number is N, the oscillating frequency $f$ is given as follows:

$$f = f_n + N \times (1/\tau) \quad (12)$$

Of course, the above relation is similarly established for changes in the oscillating frequency in the falling-down direction as well as in the rising-up direction.

Referring now to FIG. 4, it will be seen that, in a practical circuit arrangement of the adder circuit 8 of FIG. 2, such adder circuit is composed of bridge-connected resistors, and the output transducer 7 has derived therefrom signals $S_B$ and $-S_B$ which have the same delay time $\tau$ and are reversed in phase relative to each other. These signals $S_B$ and $-S_B$ are attenuated in level due to the loss of delay line 5. The output signals $S_B$ and $-S_B$ of delay line 5 are supplied to a pair of opposed connection points $a$ and $b$ of the resistor bridge forming adder circuit 8. The other opposed connection points $c$ and $d$ of the resistor bridge are respectively connected to ground and to the output terminal of variable frequency oscillator 3' from which the oscillating output signal $S_A$ is derived.

The resistance value R of each of the resistors forming the adder circuit 8 is made equal to the output impedance of output transducer 7, so that the impedance between points $a$ and $b$ is R, and thus impedance matching is attained. The oscillating output signal $S_A$ applied to the point $d$ appears at the points $a$ and $b$, respectively, with its level divided by 2 due to the voltage division effected by the resistors of circuit 8. Meanwhile, the signals $S_B$ and $-S_B$ is applied to the points $a$ and $b$, being reversed in phase relative to each other, are cancelled so that no signal results therefrom at the points $c$ and $d$.

If the oscillating output signal $S_A$ of the variable frequency oscillator 3' is again expressed as $a \sin \omega t$, and the signal $S_B$ passed through the delay line 5 is again expressed as $a' \sin \omega(t-\tau)$, then composite signals $S_C$ and $S_C'$ respectively produced at the points $a$ and $b$ are expressed as follows:

$$S_C = \frac{1}{2} a \sin \omega t + a' \sin \omega (t - \tau) \quad (13)$$

$$S_C' = \frac{1}{2} a \sin \omega t - a' \sin \omega (t - \tau) \quad (14)$$

Figure 5:
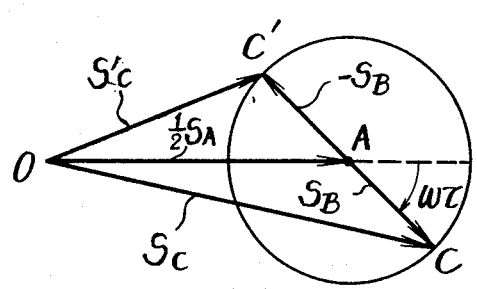
FIG. 5 is a vector diagram to which reference will be made in explaining the operation of the embodiment of FIG. 4.

These signals are represented by corresponding vectors on FIG. 5, in which OA is the vector indicating the signal $\frac{1}{2}S_A$, AC is the vector indicating the signal $S_B$ and AC' is the vector indicating the signal $-S_B$, respectively.

The vector OA is considered to be stationary with respect to vectors AC and AC', while the vectors AC and AC' are rotated about the center A in the same direction with the constant phase difference of 180° therebetween, but with the phase difference of $\omega\tau$ relative to the vector OA. Accordingly, the vectors OC and OC' represent the above-mentioned composite signals $S_C$ and $S_C'$ and the amplitude characteristics B and B' of these composite signals $S_C$ and $S_C'$ may be expressed as follows:

$$B = a \sqrt{1 + m^2 + 2m \cos \omega\tau} \quad (15)$$

$$B' = a \sqrt{1 + m^2 - 2m \cos \omega\tau} \quad (16)$$

where $m$ is $2a'/a$.

If a condition $m \ll 1$ is assumed by reason of the loss of the delay line 5, equations (15) and (16) can be rewritten as follows:

$$B = a/2 + a' \cos \omega\tau \quad (17)$$

$$B' = a/2 - a' \cos \omega\tau \quad (18)$$

Thus, the composite signals $S_C$ and $S_C'$ are amplitude-detected by diodes 9a and 9'a, respectively, to produce detected outputs which are proportional to the amplitude characteristics B and B' expressed by equations (17) and (18). These detected outputs are fed to a comparator, for example, in the form of a differential amplifier 10 for calculation, and the output voltage E of the differential amplifier 10 is as follows:

$$E = (2a' \cos \omega\tau)K' \quad (19)$$

where $K'$ is the product of the detecting efficiency and the gain of the differential amplifier 10. It will be noticed that equation (19) has the same form as an equation (5) used for explaining the operation of the circuit of FIG. 2. Therefore, it is apparent that the cyclically varied output voltage E of the differential amplifier 10 may be fed back to the control terminal of variable frequency oscillator 3' to achieve the same effect as described above with respect to the embodiment of FIG. 2.

It will be apparent that, in accordance with the invention as described above, a signal having a predetermined frequency difference between one stable point and next stable point can be produced without using the expensive and complicated 1/N frequency divider which is required in the prior art frequency synthesizer using a phase-lock-loop and which is unsuitable for obtaining a high oscillating frequency. In addition, the frequency difference between one stable point and next stable point is determined according to the characteristics of the delay line 5, and hence the frequency difference can be made quite stable.

FIG. 7 shows another embodiment of this invention in which frequency triggering of the above-described basic arrangement of the locked oscillator is effected in a digital manner. In FIG. 7, reference numeral 11 generally identifies a control voltage detector which consists of the delay line 5, adder circuit 8, diodes 9a and 9'a and differential amplifier 10 described above with reference to FIG. 4. The output voltage E of the control voltage detector 11 is varied cyclically as mentioned above and fed through a buffer amplifier 12 to the control terminal of variable frequency oscillator 3'. A charging-discharging capacitor 13 is connected between such control terminal of oscillator 3' and ground. In this embodiment, the oscillating frequency of the variable frequency oscillator 3' is controllable to rise or fall by N1/τ according to the number N of instruction pulses applied to the locked oscillator. Rising instruction pulses are supplied from a terminal 14U to a set terminal S of a flip-flip 15U and falling instruction pulses are supplied from a terminal 14D to a set terminal S of a flip-flop 15D. An output terminal Q of flip-flop 15U is connected through a diode 16U to capacitor 13 so that the capacitor 13 is charged by the output voltage from flip-flop 15U when the level of such output voltage is high, and an output terminal $\overline{Q}$ of flip-flop 15D is connected through a diode 16D to capacitor 13 so that the capacitor 13 may be discharged when the voltage level at terminal $\overline{Q}$ is low. A reset terminal R of flip-flop 15D is connected with an output of a wave shaping circuit 17 and a reset terminal R of flip-flop 15U is connected with an output of a wave shaping circuit 18. Both of the wave shaping circuits 17 and 18 are supplied with the control voltage E from control voltage detector 11. This control voltage is cyclically varied as mentioned above with reference to FIG. 6B so that wave shaping circuit 17 produces a pulse during each negative half cycle of the control voltage and wave shaping circuit 18 produces a pulse during each positive half cycle thereof. To this end, the threshold level of each of the wave shaping circuits 17 and 18 can be practically selected to be a predetermined value.

With the above described circuit arrangement, if one rising instruction pulse is fed from the terminal 14U to the flip-flop 15U to set the same, the output signal at its output terminal $\overline{Q}$ is increased in level, as shown in FIG. 8A. Such high level of the output signal at terminal Q is sufficiently high to drive oscillator 3' to its maximum output frequency. In this case, flip-flop 15D is in a reset condition and the output signal at its output terminal Q is kept at a high level. Accordingly, capacitor 13 is charged so that the oscillating frequency of variable frequency oscillator 3' is released from being locked to, for example, the frequency $f_n$ and is enhanced or increased. At this time, the control voltage from detector 11 is varied, as shown in FIG. 8B. When the frequency exceeds the unstable point $f_n'$, the wave shaping circuit 18 generates a pulse signal shown in FIG. 8C in response to the positive half-cycle of the control voltage. Accordingly, flip-flop 15U is reset, as shown in FIG. 8A, by the trailing edge of the pulse signal from wave shaping circuit 18, which trailing edge occurs near the locked frequency $f_{n+1}$, so that further charging of capacitor 13 is stopped. Thus, the operation of increasing the voltage across capacitor 13 and thereby increasing the output frequency of oscillator 3' from the starting value of $f_n$, gives rise to the production by the detector 11 of the control voltage shown on FIG. 8B which is superposed on the voltage across capacitor 13 and is effective to lock the oscillating frequency of variable frequency oscillator 3' at the next higher stable frequency of $f_{n+1}$. If the capacitor 13 is spontaneously discharged or the voltage thereacross is decreased to decrease the frequency of oscillator 3', the resulting change in the control voltage from detector 11 is operative to maintain the voltage across the capacitor 13 constant, and the oscillating frequency is locked to the value $f_{n+1}$. The above described operation is carried out each time a rising instruction pulse is supplied to terminal 14U.

If a falling instruction pulse is applied to terminal 14D at a time when the oscillating frequency has been locked to the value $f_{n+1}$, flip-flop 15D is set and the output signal or potential at the output terminal $\overline{Q}$ becomes low in level, as shown on FIG. 8D. Consequently, capacitor 13 is discharged through diode 16D to lower the oscillating frequency. When the oscillating frequency in being thus lowered passes the unstable point $f_n'$, the control voltage from detector 11 causes wave shaping circuit 17 to generate a pulse shown in FIG. 8E. The flip-flop 15D is reset by the trailing edge of this pulse in the vicinity of the locked frequency $f_n$ so that the potential or output signal at the output terminal $\overline{Q}$ returns to its higher level, as shown on FIG. 8D. As a result, further discharging of capacitor 13 is stopped and the control voltage from detector 11 (FIG. 8B) thereafter functions to maintain constant the voltage across capacitor 13 at a level corresponding to the oscillating frequency being locked to the value $f_n$. Thus, each time a falling instruction pulse is applied to terminal 14D, the oscillating frequency of oscillator 3' is lowered to the next lower stable frequency point.

When the frequency triggering operation is thus carried out in a digital manner by the rising or falling instruction pulses, these pulses are counted by a reversible counter 19 and its content is given through a decoder to an indicator 21 for displaying the frequency to which oscillator 3' is locked. Thus, the frequency display can be performed with ease.

FIG. 9 shows a further embodiment of this invention, in which elements corresponding to those described above with reference to FIG. 7 are identified by the same reference numerals. In the embodiment of FIG. 9 a sweep circuit 28 is provided to generate a sawtooth waveform sweep voltage which is applied to the control terminal of oscillator 3'. As such sawtooth waveform sweep voltage rises from the reference level, the oscillating frequency of the variable frequency oscillator 3 is increased and the output voltage E of the control voltage detector 11 is varied cyclically as shown on FIG. 8B. This output voltage E is wave-shaped by a wave shaping circuit 29 to produce a pulse during each positive half cycle of the output voltage. The number of pulses from circuit 29, which corresponds to the number of stable or locked frequency points through which the frequency of oscillator 3' has been increased, is counted by a counter 26.

Further, in the embodiment of FIG. 9, reference numeral 22 represents an operating key, and the number of times that operating key 22 is depressed is converted into a predetermined code by an encoder 23 and stored in a memory circuit 24. A comparator circuit 25 acts to compare the number stored in memory circuit 24 with the number of the contents of counter 26 to produce a detected output when both the numbers coincide with each other. This detected output from comparator circuit 25 is fed to a sweep stop signal generating circuit 27 to drive the same and a resultant sweep stop signal is fed to sweep circuit 28 to halt the generation of the sweep voltage by the latter, whereupon the voltage then obtaining is held by charging-discharging capacitor 13.

According to the above arrangement, when the number established by operating key 22 coincides with the number of the contents of the counter 26, the oscillating frequency of the variable frequency oscillator 3' is locked to the corresponding stable or locked frequency. Further, when the sweep voltage generated by sweep circuit 28 reaches its maximum value, sweep circuit 28 is reset to reduce its sweep voltage to the reference voltage and also to provide a reset pulse for the counter 26 by which the latter is made to change its content to the reference value. Accordingly, when the content of memory circuit 24 resulting from operation of key 22 becomes less than that of counter 26, the sweep voltage produced by circuit 28 is increased to the maximum and then reset to the reference level. At the same time, the counter 26 is reset to the reference value and the sweep operation is initiated again. When the content of the counter 26 thereafter coincides with that of the memory circuit 24, the sweep operation is stopped to lock the oscillating frequency to the corresponding stable value.

The oscillating frequency of oscillator 3' can be displayed by feeding the content of the counter 26 through a decoder 30 to an indicator 31. In the example shown in FIG. 9, the sweep operation is carried out only in one direction, that is, in rising-up direction, but bidirectional (rising-up and falling-down) sweep operation may also be employed.

Figure 10:
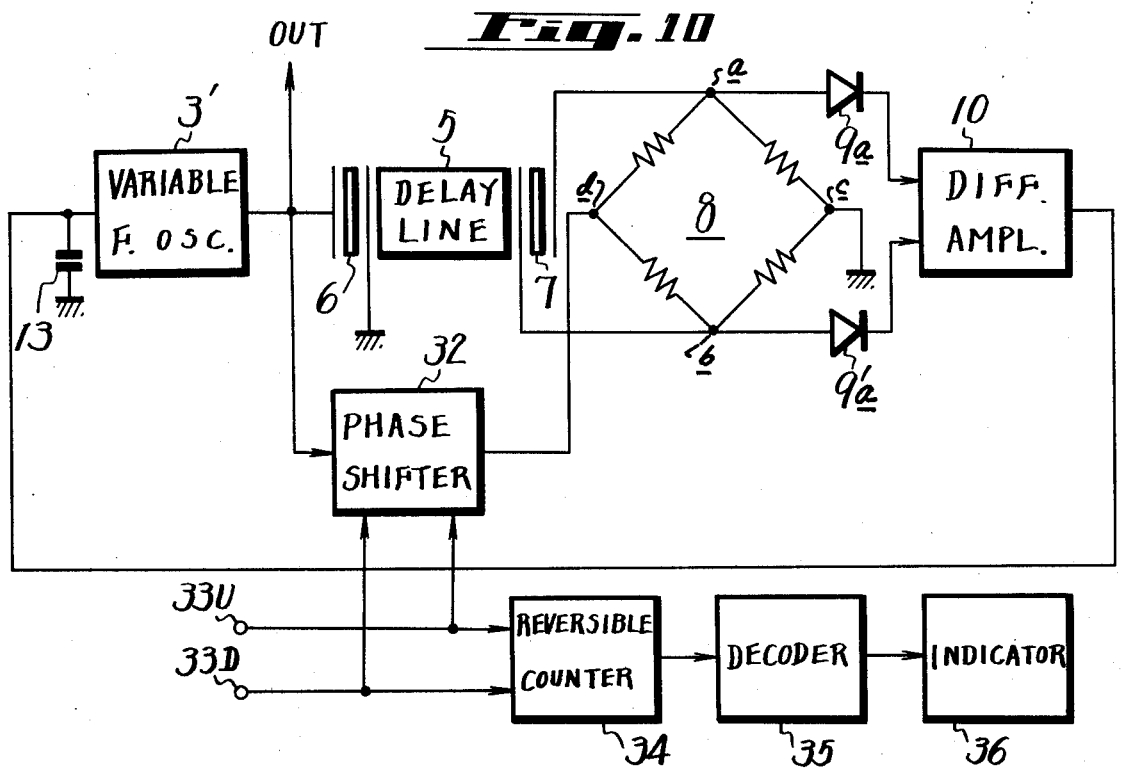

FIG. 10 shows still another embodiment of this invention in which elements corresponding to those described above with reference to FIG. 4 are identified by the same reference numerals. In this embodiment, an oscillating signal from the variable frequency oscillator 3' is supplied through a phase shifter 32 to the adder circuit 8. The phase shifter 32 acts to advance by 90° the phase of the oscillating signal passed therethrough to adder 8 when one rising instruction pulse is supplied from a terminal 33U, and to delay the phase of the oscillating signal by 90° when one falling instruction pulse is supplied from a terminal 33D.

Figure 11:
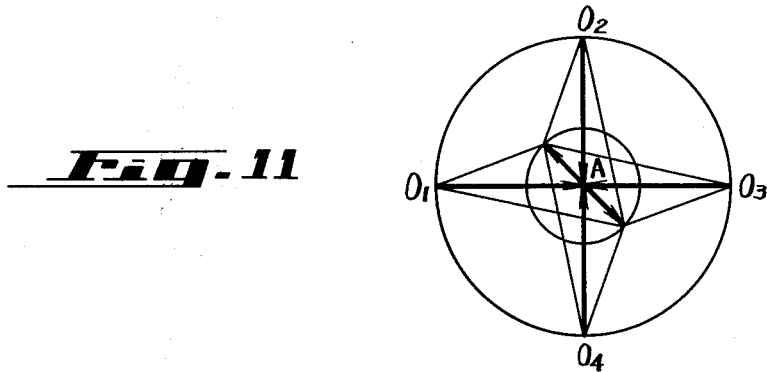
FIGS. 11 and 12 are vector and waveform diagrams to which reference will be made in explaining the operation of the embodiment shown in FIG. 10.
Figure 12:
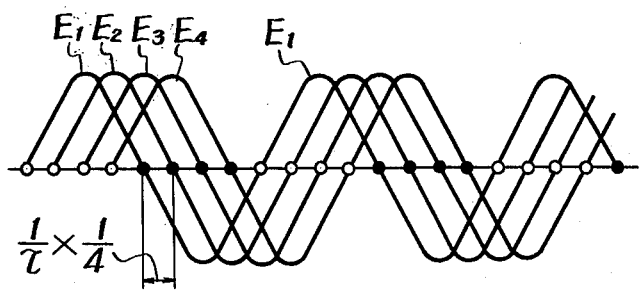

When the phase of the oscillating signal passed through phase shifter 32 is advanced by 90° each time a rising instruction pulse is applied to the terminal 33U, the vector diagram of FIG. 11, in which it is assumed the clockwise direction is the advance direction, shows that the vector $O_1A$ is rotated to the positions $O_2A \rightarrow O_3A \rightarrow O_4A \rightarrow O_1A$ . . . , successively. Accordingly, as shown on FIG. 12, the control voltage of the differential amplifier 10 is varied as $E_1 \rightarrow E_2 \rightarrow E_3 \rightarrow E_4 \rightarrow E_1$ . . . each time the phase of the oscillating signal applied to point $d$ of adder 8 is advanced by 90°. As a result, the oscillating frequency of the variable frequency oscillator 3' rises according to the number of the rising instruction pulses. In this case, the interval between the successive or adjacent stable frequencies to which oscillator 3' is locked is ¼τ. Further, when a falling instruction pulse is applied to the terminal 33D, an operation reverse to that described above is effected to lower the oscillating frequency of oscillator 3' in a step-by-step manner, with the interval between the successive stable frequencies being again ¼τ.

With the locked oscillator of FIG. 10, the frequency to which oscillator 3' is locked can be displayed or indicated by counting each rising or falling instruction pulse by means of a reversible counter 34, and by applying the content of counter 34 through a decoder 35 to an indicator 36.

Although several embodiments of the invention have been described in detail herein with reference to the accompanying drawings, it is to be understood that the invention is not limited to those precise embodiments, and that various changes and modifications can be effected therein by one skilled in the art without departing from the scope or spirit of the invention as defined in the appended claims.

What is claimed is:
1. A stabilized frequency oscillating circuit comprising, a variable frequency oscillator for providing an output at a frequency determined by the amplitude of a control signal applied to said oscillator; delay means receiving said output of the oscillator for providing a delayed output; control signal generating means receiving the outputs of said oscillator and delay means, respectively, and synthesizing a control signal therefrom which varies in amplitude in response to changes in the frequency of said output from the oscillator, said control signal generating means including an adder for adding said outputs of the oscillator and delay means, respectively, and providing at least one added output, and detecting means for detecting said added output and providing a detected output with the magnitude of the latter corresponding to that of said added output; and means for applying said synthesized control signal to said oscillator as at least part of said control signal for the latter so as to lock said output of the oscillator to a desired frequency.

2. A stabilized frequency oscillating circuit comprising, a variable frequency oscillator for providing an output at a frequency determined by the amplitude of a control signal applied to said oscillator; delay means receiving said output of the oscillator for providing a delayed output; control signal generating means receiving the outputs of said oscillator and delay means, respectively, and synthesizing a control signal therefrom which varies in amplitude in response to changes in the frequency of said output from the oscillator, said control signal generating means including first means for adding said outputs of the oscillator and delay means, respectively, and providing a first added output, second means for adding said outputs of the oscillator and delay means, respectively, with one of said outputs having its phase inverted in respect to the phase of said one output as applied to said first means so as to provide a second added output, and comparator means comparing said first and second added outputs for providing a compared output as said synthesized control signal; and means for applying said synthesized control signal to said oscillator as at least part of said control signal for the latter so as to lock said output of the oscillator to a desired frequency.

3. A stabilized frequency oscillating circuit comprising, a variable frequency oscillator for providing an output at a frequency determined by the amplitude of a control signal applied to said oscillator, delay means receiving said output of the oscillator for providing a delayed output, means for adding the outputs of said oscillator and delay means, respectively, and providing therefrom a synthesized control signal having an amplitude which varies cyclically in response to changing of the frequency of said output of the oscillator, and means for applying said synthesized control signal to said oscillator as at least part of said control signal for the latter so as to lock said output of the oscillator to a desired frequency.

4. A stabilized frequency oscillating circuit according to claim 3; in which said means for applying said synthesized control signal to said oscillator includes a capacitor receiving said synthesized control signal and being connected to said oscillator so that said control signal for the latter is constituted by the voltage across said capacitor.

5. A stabilized frequency oscillating circuit according to claim 4; further comprising frequency changing means for changing said desired frequency to which said output of the oscillator is to be locked.

6. A stabilized frequency oscillating circuit according to claim 5, in which said frequency changing means includes means for phase-shifting one of said outputs of the oscillator and delay means, respectively, prior to said adding of said outputs.

7. A stabilized frequency oscillating circuit according to claim 5; in which said frequency changing means includes means for applying an additional control signal to said capacitor so that said voltage across said capacitor is determined by said additional control signal and said synthesized control signal.

8. A stabilized frequency oscillating circuit according to claim 7; in which said means for applying an additional control signal to said capacitor includes first and second flip-flop circuit means adapted to be set in response to the application thereto of rising and falling instruction pulses, respectively, and having outputs connected to said capacitor, said first flip-flop circuit means, when set, having a relatively high voltage at the respective output for charging said capacitor, said second flip-flop circuit means, when set, having a relatively low voltage at the respective output for discharging said capacitor, and means responsive to positive and negative portions of said cyclically varying synthesized control signal for resetting said first and second flip-flop circuit means, respectively.

9. A stabilized frequency oscillating circuit according to claim 7; in which said means for applying an additional control signal to said capacitor includes sweep signal generating means for providing a sawtooth signal which is applied to said capacitor, means for generating a selected number of control pulses, means for generating comparison pulses in response to selected portions of said cyclically varying synthesized control signal, and means for halting operation of said sweep signal generating means when the number of said comparison pulses equals the number of said control pulses.

10. A stabilized frequency oscillating circuit according to claim 3; further comprising frequency changing means for changing said desired frequency to which said output of the oscillator is to be locked.

11. A stabilized frequency oscillating circuit according to claim 10; in which said frequency changing means includes means for phase-shifting one of said outputs of the oscillator and delay means, respectively, prior to said adding of said outputs.

12. A stabilized frequency oscillating circuit according to claim 10; in which said frequency changing means includes means for applying an additional control signal to said oscillator so that said control signal is determined by said additional control signal and said synthesized control signal.

13. A stabilized frequency oscillating circuit according to claim 12; in which said means for applying an additional control signal to said oscillator includes sweep signal generating means for providing a sawtooth sweep signal, means for generating a selected number of control pulses, means for generating comparison pulses in response to selected portions of said cyclically varying synthesized control signal, and means for halting operation of said sweep signal generating means when the number of said comparison pulses equals the number of said control pulses.

* * * * *